United States Patent [19]
Park et al.

[11] Patent Number: 5,893,050
[45] Date of Patent: Apr. 6, 1999

[54] METHOD FOR CORRECTING THIN-FILM FORMATION PROGRAM OF SEMICONDUCTOR DEVICE AND THICKNESS MEASURING APPARATUS THEREFOR

[75] Inventors: Byung-suk Park; Ill-hwan Jeoun, both of Suwon, Rep. of Korea

[73] Assignee: Samsung Electronics Co., Ltd., Suwon, Rep. of Korea

[21] Appl. No.: 745,360

[22] Filed: Nov. 8, 1996

[30] Foreign Application Priority Data

Nov. 8, 1995 [KR] Rep. of Korea ................. 1995-40265

[51] Int. Cl.⁶ .......................... G06F 19/00; G01C 25/00
[52] U.S. Cl. ........................ 702/97; 118/724; 702/136; 702/170; 364/528.35
[58] Field of Search ................ 364/571.02, 528.35; 438/484; 348/479, 150, 166, 287; 118/69, 724; 252/66, 67, 351; 324/671, 663; 356/352, 381

[56] References Cited

U.S. PATENT DOCUMENTS

| | | | |
|---|---|---|---|
| 5,120,966 | 6/1992 | Kondo | 250/372 |
| 5,148,710 | 9/1992 | Gudehus et al. | 73/335.06 |
| 5,285,075 | 2/1994 | Kurokawa | 118/719 |
| 5,571,749 | 11/1996 | Matsuda et al. | 437/113 |

*Primary Examiner*—Kamini S. Shah
*Attorney, Agent, or Firm*—Jones & Volentine, L.L.P.

[57] ABSTRACT

A method for correcting a thin-film formation program of semiconductor device includes the steps of measuring a thin-film thickness formed by thin-film formation equipment controlled by a thin-film formation program while cooling a wafer on which a thin-film has been formed; transforming the measured thickness into an electrical signal ($d_m$); transforming a target thickness into a standard electrical signal ($d_o$); comparing the electrical signal ($d_m$) with the standard electrical signal ($d_o$), and outputting a first signal to the thin-film formation equipment if the electrical signal ($d_m$) is less than the standard electrical signal ($d_o$) and outputting a second signal to the thin-film formation equipment if the electrical signal ($d_m$) is greater than the standard electrical signal ($d_o$). The first signal increases, and the second signal decreases the process variables of thin-film formation program. As a result, thickness uniformity can be maintained without error or time delay, by automatically correcting the thin film formation program.

6 Claims, 3 Drawing Sheets

5,893,050

METHOD FOR CORRECTING THIN-FILM FORMATION PROGRAM OF SEMICONDUCTOR DEVICE AND THICKNESS MEASURING APPARATUS THEREFOR

BACKGROUND OF THE INVENTION

1. Field of the Invention

The present invention relates to a method for correcting a thin-film formation program of a semiconductor device and a thickness measuring apparatus therefor, and more particularly, to a method for correcting a thin-film formation program of a semiconductor device and a thickness measuring apparatus therefor, which is capable of obtaining a desired thin film thickness while preventing process failures and delays.

2. Background of the Related Art

To maintain reliability in the characteristics of a semiconductor device, the thin-films formed on wafers in each manufacturing process must be of uniform thickness. Generally, the process of thin-film formation has many variables (e.g., temperature, time, pressure, and gas flow rate) according to the thin-film material. If the process variables deviate from a predetermined value for a thin-film formation program, the thickness of the thin-film to be formed departs from the standard. Accordingly, in order to keep the uniformity of thin-film thicknesses, accurate information must be secured regarding the thicknesses of thin-films in response to a change in the process variables. Also, whenever the thickness of the thin-film departs from the standard, the process variables of the program must be promptly changed.

FIG. 1 illustrates a process of correcting a thin-film formation program for a semiconductor device according to the prior art.

In Step 1, thin-films of a semiconductor device are formed in a thin-film deposition unit (e.g., sputtering equipment, chemical vapor deposition equipment or an oxidation/diffusion furnace). In Step 2, the thickness of the thin-film formed in Step 1 is measured by using a thickness-measuring apparatus with a mechanical stylus, for example, an M-gauge or ellipsometer. In Step 3, the measured thickness is compared with a standard thickness. If the thickness differential in Step 3 is greater than a predetermined allowable deviation, the exact process variables of the thin-film formation program are calculated in Step 4 for correcting the thin-film formation program.

On the other hand, if the thickness differential in Step 3 is less than the allowable deviation, it is assumed that the reliability in the characteristics of the semiconductor device can be maintained, and, as a result, the next process for forming a thin-film can proceed in Step 5 without the need for any correction of the process variables of the thin-film formation program.

However, if the decision in Step 3, regarding the difference between the measured thickness and the standard thickness, and in Step 4, regarding the correction for the thin-film forming program are both manually made, the following problems may occur: i) the thickness may depart from the standard due to a correction error; ii) delays occur when the thin-film formation equipment is idled while the uniformity of the thicknesses of thin-films is checked periodically; and iii) product damage may result should immediate correction not be made.

FIG. 2 is a cross section of a cooling chamber 100 where a wafer on which the metal deposition process has been completed is cooled, within metal deposition equipment according to the prior art.

In a metal deposition process, a wafer is usually heated to a high temperature. Referring to FIG. 2, a processed wafer 10 is cooled to room temperature on a pedestal 20. The cooling chamber 100 is isolated from the exterior by a chamber wall 50 and a chamber lid 60 installed atop the chamber wall. After the cooling process is completed, the processed wafer 10 is lifted by a wafer lifter 30. Then, an isolation valve 40 is opened to pass a robot arm (not shown) for wafer transfer. After the transfer of the processed wafer 10 is completed, the isolation valve 40 is closed again.

The cooling chamber having the above structure only performs the function of cooling a high-temperature processed wafer. After the wafer is transferred to the exterior, the thickness of thin-film on the wafer can be measured by various thickness-measuring apparatus in accordance with the type of thin-film. In general, the thickness measurements are manually performed by an operator. If the difference between the measured thickness and the standard thickness is larger than the allowable deviation, the process variables of the thin-film formation program are manually calculated and corrected.

As stated above, some problems may occur, such as, a departure from the thickness standard due to a mistake by an operator who is manually correcting the process variables of the program. Also, delays are caused when the thin-film forming equipment is idled while periodically checking the uniformity of the thin-film thickness. Finally, an increase in product damage may occur should immediate correction not be made upon departure from the standard thickness.

SUMMARY OF THE INVENTION

Therefore, it is an object of the present invention to provide a method for correcting a thin-film formation program of a semiconductor device which is capable of preventing process delays and accidents.

Also, it is another object of the present invention to provide a thickness measuring apparatus used for the thin-film formation program correcting method.

To accomplish these and other objects of the present invention, there is provided a method for correcting a thin-film formation program of semiconductor device, comprising the steps of: measuring a thin-film thickness formed by thin-film formation equipment controlled by a thin-film formation program while cooling a wafer on which a thin-film has been formed; transforming the measured thickness into an electrical signal ($d_m$) proportional to the measured thickness; transforming a target thickness into a standard electrical signal ($d_0$) proportional to the target thickness; comparing the electrical signal ($d_m$) with the standard electrical signal ($d_0$); outputting a first signal to the thin-film formation equipment if the electrical signal ($d_m$) is less than the standard electrical signal ($d_0$); and outputting a second signal to the thin-film formation equipment if the electrical signal ($d_m$) is greater than the standard electrical signal ($d_0$), wherein the first signal increases, and the second signal decreases the process variables of the thin-film formation program.

In another aspect, the present invention provides a thickness measuring apparatus used for correcting a thin-film formation program of a semiconductor device, the apparatus comprising a supporting member on which a wafer is cooled after a thin film is formed by thin-film formation equipment; a wafer lifter for lifting the cooled wafer from the supporting member while conducting a wafer transfer; a chamber wall surrounding the supporting member and the wafer lifter; a chamber lid installed on top of the chamber wall; and a plurality of thin-film thickness measuring sensors formed in the chamber lid.

It is preferable that the thin-film thickness measuring sensors do not contact the wafer during the thickness measuring.

It is also preferable that the thin-film formation equipment is single-type metal deposition equipment, because the single-type equipment is more sensitive to the variation of process variables than batch-type equipment.

According to the embodiment of the present invention, the thickness deviation generated between the thicknesses of the thin-films formed on wafers can be corrected quickly and accurately.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
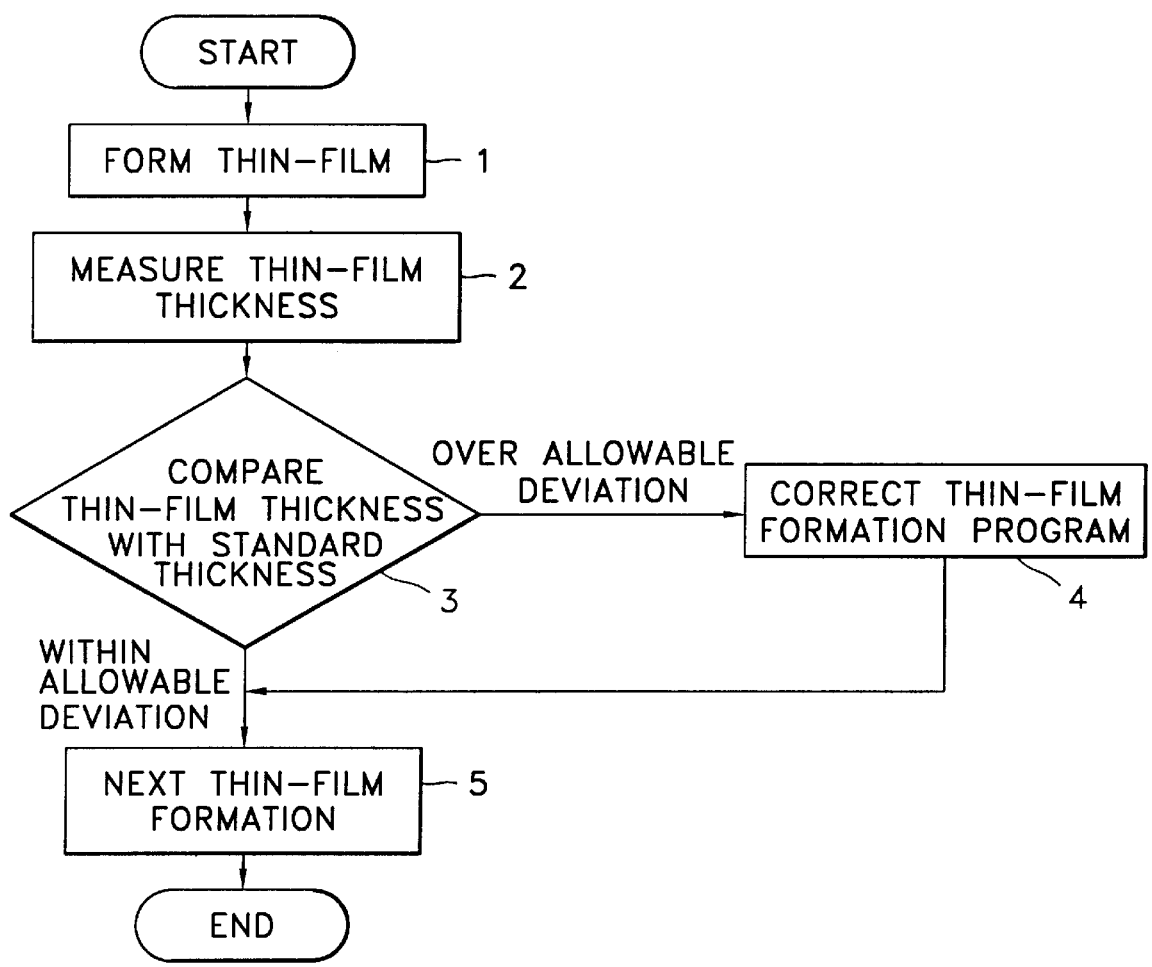
FIG. 1 illustrates a process of correcting a thin-film formation program according to the prior art.
Figure 2:
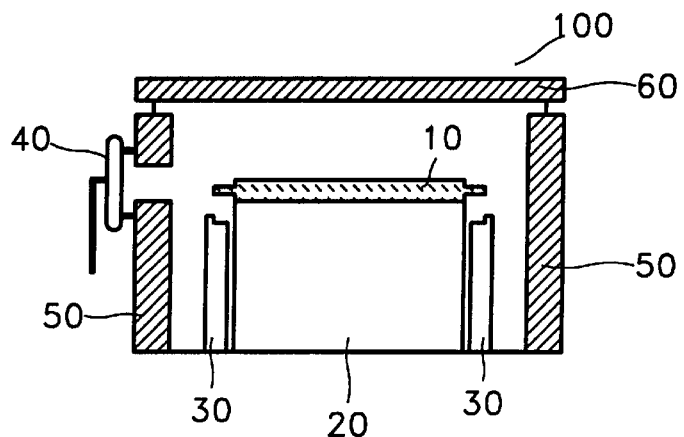
FIG. 2 is a cross section of a cooling chamber within metal deposition equipment according to the prior art.
Figure 3:
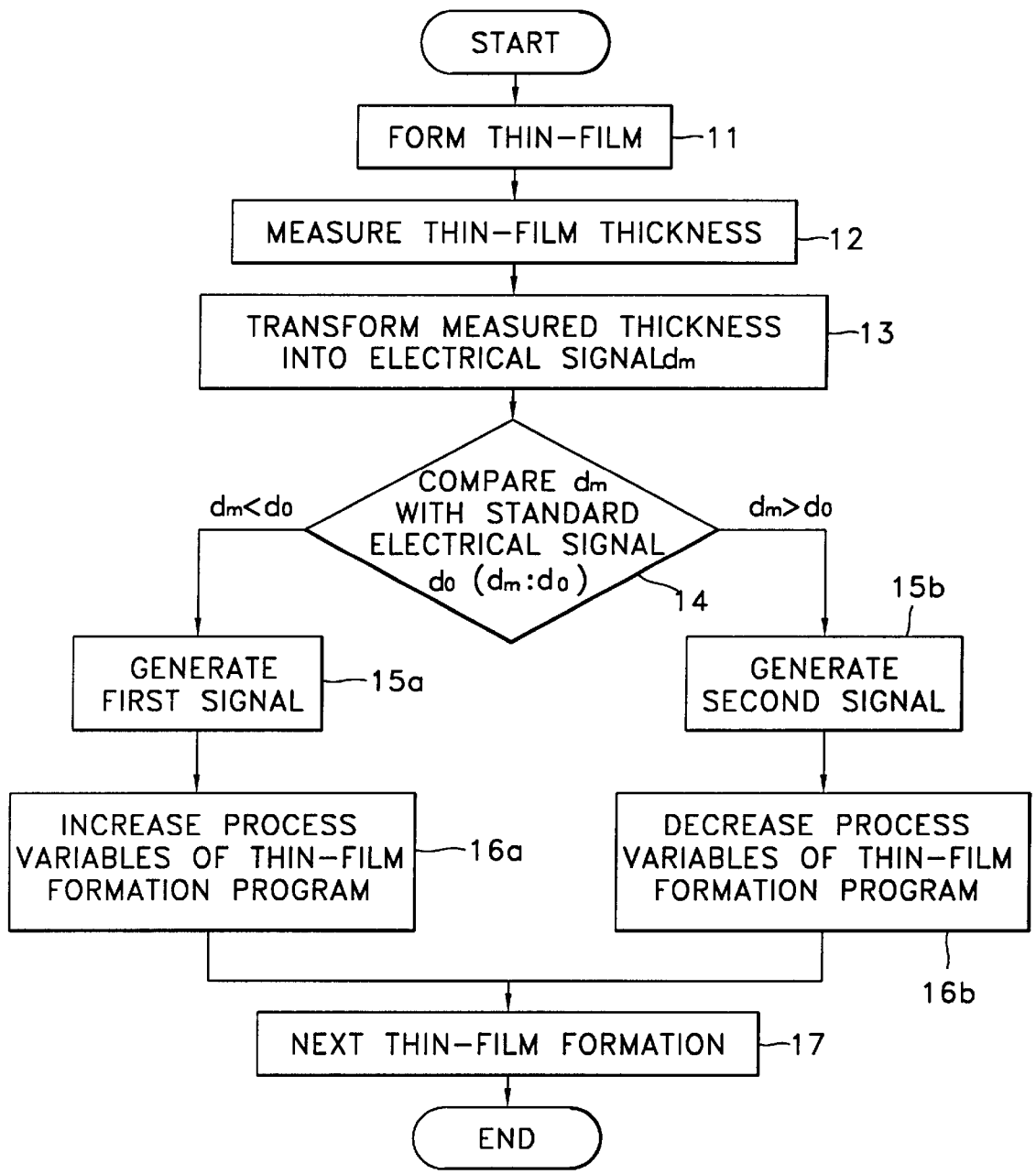
FIG. 3 illustrates a process of correcting a thin-film formation program according to the present invention.

FIG. 3 illustrates the method for correcting a thin-film formation program of a semiconductor device, according to an embodiment of the present invention.

In Step 11, thin-films of a semiconductor device are formed in thin-film deposition equipment (e.g., sputtering equipment, chemical vapor deposition equipment, or an oxidation furnace). In Step 12, the thickness of the thin-film formed in Step 11 is measured, using a thickness-measuring apparatus, while cooling the wafer. In Step 13, the measured thickness is transformed into an electrical signal ($d_m$) proportional to the measured thickness value. In Step 14, the electrical signal ($d_m$) is compared with a standard electrical signal ($d_0$) proportional to a target thickness value. According to the result of the above comparison, in Step 15a, a first signal is generated if the electrical signal ($d_m$) is less than the standard electrical signal ($d_0$). In Step 16a, the first signal increases the process variables of the thin-film formation program, such that the process variables make the film thicker in proportion to the previous variable value.

On the other hand, in Step 15b, a second signal is generated if the electrical signal ($d_m$) is greater than the standard electrical signal ($d_0$). In Step 16b, the second signal decreases the process variables of the thin-film formation program, such that the process variables make the film thinner in proportion to the previous variable value.

After the first and the second signals correct the process variables of the thin-film formation program in Steps 16a and 16b, the next thin film can be formed without delay (Step 17).

Figure 4:
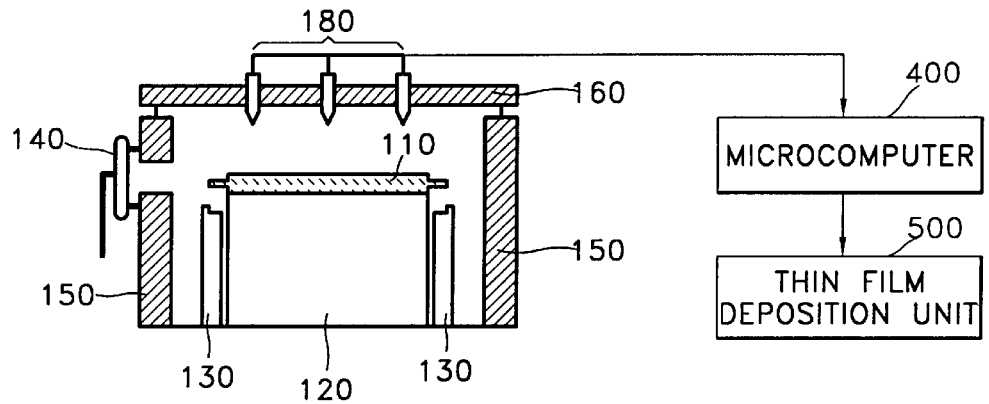
FIG. 4 is a cross section of a metal thin-film thickness measuring apparatus in a cooling chamber within metal deposition equipment according to the present invention.

FIG. 4 is a cross section of a thin-film measuring apparatus installed in a cooling chamber within metal deposition equipment according to the present invention.

Here, a plurality of thickness measuring sensors 180 are loaded on a chamber lid 160 installed atop a chamber wall 150. It is preferable that the thickness measuring sensors 180 sense the thickness by non-contact means, as is the case with an M-gauge or other equivalent device, to prevent particle generation.

Figure 5:
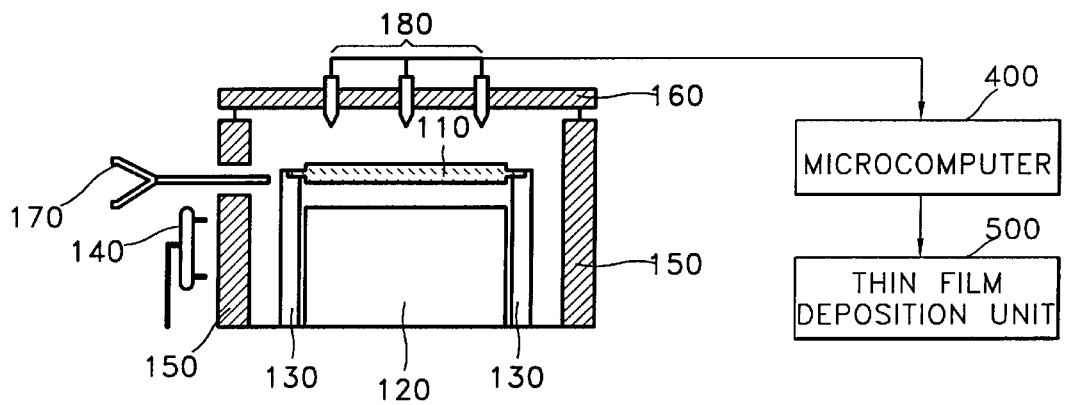
FIG. 5 shows a step of measuring the thin-film thickness and transferring the cooled wafer from the cooling chamber of FIG. 4.

FIG. 5 shows a step of measuring the thin-film thickness and transferring the cooled wafer from the cooling chamber of FIG. 4.

Referring to FIG. 5, a processed wafer 110 loaded on a pedestal 120 is lifted by a wafer lifter 130 during the wafer transfer. At this time, the thin-film thickness of the processed wafer 110 is sensed by a plurality of thickness measuring sensors 180. After the thickness measurement, an isolation valve 140 is opened to pass a robot arm 170 for transferring the processed wafer 110. After the transfer of the processed wafer 110 is completed, the isolation valve 140 is closed again.

The thin-film thickness measured in the above apparatus is supplied to a microcomputer 400 and is transformed into an electrical signal ($d_m$) proportional to the measured thickness value. Then, the electrical signal ($d_m$) is compared with a predetermined reference value ($d_0$) to selectively output a first signal, to increase process variables of the metal thin-film deposition program, and a second signal, to decrease the process variables thereof. Then, the first and second signals are used for correcting a thin-film formation program of a metal deposition device 500. Through the above processes, the metal thin-film deposition program is automatically corrected.

Figure 6:
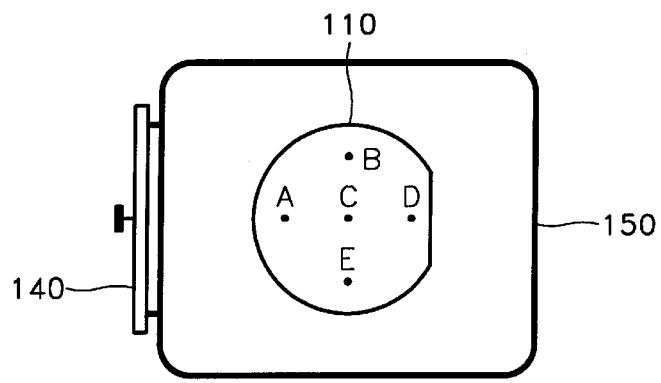
FIG. 6 is a plan view for schematically showing the thickness-measuring position on the wafer.

FIG. 6 is a plan view for schematically showing the thickness-measuring positions for the wafer 110, where the chamber lid is removed to show the inner portion of cooling chamber. Here, five points, A–E, on the wafer 110 illustrate the positions measured by the thickness measuring sensors 180.

According to the embodiment of the present invention, thickness uniformity can be maintained without error or time delay, by automatically correcting the thin film formation program.

As described above, the present invention has been explained by way of an illustrated embodiment. However, the present invention is not limited to the forgoing embodiment, and it is apparent that various changes and improvements may be effected by those skilled in the art.

What is claimed is:

1. A method for correcting a thin-film formation program of a semiconductor device, said method comprising:

measuring, in a cooling chamber, a thin-film thickness formed by thin-film formation equipment controlled by a thin-film formation program, said measuring being performed by sensors while simultaneously cooling a wafer on which a thin-film has been formed;

transforming the measured thickness into an electrical signal ($d_m$) proportional to the measured thickness;

transforming a target thickness into a standard electrical signal ($d_0$) proportional to the target thickness;

comparing the electrical signal ($d_m$) with the standard electrical signal ($d_0$);

outputting a first signal to said thin-film formation equipment if the electrical signal ($d_m$) is less than the standard electrical signal ($d_0$); and outputting a second signal to said thin-film formation equipment if the electrical signal ($d_m$) is greater than the standard electrical signal ($d_0$), wherein said method is automated and said first signal increases, and said second signal decreases the process variables of the thin-film formation program.

2. A thickness measuring apparatus used for correcting a thin-film formation program of a semiconductor device, said apparatus comprising:

a supporting member on which a wafer is cooled after a thin film is formed by thin-film formation equipment;

a wafer lifter for lifting the cooled wafer from said supporting member while conducting a wafer transfer;

a chamber wall surrounding the supporting member and the wafer lifter;

a chamber lid installed on top of the chamber wall; and a plurality of thin-film thickness measuring sensors formed in the chamber lid.

3. The apparatus of claim 2, wherein the plurality of thin-film thickness measuring sensors do not contact the wafer during the thickness measuring.

4. The apparatus of claim 3, wherein the plurality of thin-film thickness measuring sensors are M-gauges.

5. The apparatus of claim 2, wherein the plurality of thin-film thickness measuring sensors is five, whereby four thin-film thickness measuring sensors are proportionally spaced in the chamber lid so as to measure a thickness of the thin-film around the periphery of the wafer, and a fifth thin-film thickness measuring sensor is disposed to measure a thickness of the thin-film at a center of the wafer.

6. The apparatus of claim 2, wherein the thin-film formation equipment is single-type metal deposition equipment.

* * * * *